US008664561B2

(12) United States Patent
Hadidi et al.

(10) Patent No.: US 8,664,561 B2
(45) Date of Patent: Mar. 4, 2014

(54) SYSTEM AND METHOD FOR SELECTIVELY CONTROLLING ION COMPOSITION OF ION SOURCES

(75) Inventors: Kamal Hadidi, Somerville, MA (US); Rajesh Dorai, Woburn, MA (US); Bernard G. Lindsay, Danvers, MA (US); Vikram Singh, North Andover, MA (US); George D. Papasouliotis, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1175 days.

(21) Appl. No.: 12/496,080

(22) Filed: Jul. 1, 2009

(65) Prior Publication Data

US 2011/0000896 A1    Jan. 6, 2011

(51) Int. Cl.
    *B23K 10/00*    (2006.01)
(52) U.S. Cl.
    USPC ............ 219/121.59; 219/121.43; 219/121.44; 156/345.39; 156/345.47; 118/723 FI
(58) Field of Classification Search
    CPC ..................................................... B23K 10/00
    USPC ............... 219/121.4, 121.41, 121.43, 121.44, 219/121.54, 121.48; 118/723 MP, 723 R; 156/345.39, 345.47, 345.43, 345.44
    See application file for complete search history.

(56) References Cited

U.S. PATENT DOCUMENTS

| 5,968,377 A * | 10/1999 | Yuasa et al. ............... 219/121.41 |
| 6,182,604 B1 | 2/2001 | Goeckner et al. |
| 6,253,704 B1 | 7/2001 | Savas |
| 6,335,535 B1 * | 1/2002 | Miyake et al. ........... 250/492.21 |
| 7,095,179 B2 | 8/2006 | Chistyakov |
| 2002/0007793 A1 | 1/2002 | Sakai et al. |
| 2002/0008480 A1 * | 1/2002 | Yamazaki et al. ....... 315/111.21 |
| 2003/0101935 A1 | 6/2003 | Walther |

(Continued)

FOREIGN PATENT DOCUMENTS

| TW | 472290 B | 1/2002 |
| WO | 9702589 A1 | 1/1997 |
| WO | 2008147095 A1 | 12/2008 |
| WO | 2011002688 A1 | 1/2011 |

OTHER PUBLICATIONS

Meige, M., et al., "Particle-In-Cell Simulation of an Electron Shock Wave in a Rapid Rise Time Plasma Immersion Ion Implantation Process"; Physics of Plasmas, vol. 12, 043503; Mar. 25, 2005, pp. 1-4.

(Continued)

*Primary Examiner* — Mark Paschall

(57) ABSTRACT

A method is disclosed for adjusting the composition of plasmas used in plasma doping, plasma deposition and plasma etching techniques. The disclosed method enables the plasma composition to be controlled by modifying the energy distribution of the electrons present in the plasma. Energetic electrons are produced in the plasma by accelerating electrons in the plasma using very fast voltage pulses. The pulses are long enough to influence the electrons, but too fast to affect the ions significantly. Collisions between the energetic electrons and the constituents of the plasma result in changes in the plasma composition. The plasma composition can then be optimized to meet the requirements of the specific process being used. This can entail changing the ratio of ion species in the plasma, changing the ratio of ionization to dissociation, or changing the excited state population of the plasma.

22 Claims, 18 Drawing Sheets

(56) References Cited

U.S. PATENT DOCUMENTS

2005/0184669 A1    8/2005    Chistyakov
2006/0289799 A1    12/2006    Fang et al.
2008/0026133 A1    1/2008    Fang et al.
2008/0122368 A1    5/2008    Saito et al.

OTHER PUBLICATIONS

Seo et al., "Efficient electron heating in short-plused magnetron discharges", Journal of Applied Physics, vol. 98, No. 083302, (2005), pp. 1-11.

Bhattacharjee et al., "Plasma buildup by short-pulse high-power microwaves", Journal of Applied Physics, vol. 89, No. 7, Apr. 1, 2001, pp. 3573-3579.

Lee et al., "A Low Redeposition Rate High Density Plasma CVD Process for High Ratio 175 nm Technology and Beyond", Proceeding of the 1999 IEEE International Interconnect Technology Conference, May 1999, IITC vol. 99, pp. 152-154.

Lim et al., "Gap-fill Performance and Film Properties of PMD Films for the 65 nm Device Technology", 2003 IEEE, pp. 435-438.

\* cited by examiner

SYSTEM AND METHOD FOR SELECTIVELY CONTROLLING ION COMPOSITION OF ION SOURCES

BACKGROUND OF THE INVENTION

1. Field of the Invention

Embodiments of the invention relate to the field of plasma generation. More particularly, the present invention relates to a system and method for selectively controlling the density, temperature, and composition of ions and radicals and the density and energy of electrons in sub-atmospheric pressure plasmas.

2. Discussion of Related Art

Plasmas are used in a variety of ways in semiconductor processing, such as plasma enhanced chemical vapor deposition (PECVD), and substrate doping. Such processes involve the directional deposition or doping of ions on or beneath the surface of a targeted substrate, such as silicon wafers. Other processes include plasma etching, where the directionality of the etching species determines the quality of the trenches to be etched.

Typical plasma doping processes exploit the charged nature of ions within the plasma to deposit the ions on or beneath a targeted surface while plasma deposition processes rely on neutrals to deposit on the surface of the substrate. Because neutrals are not charged, they can be difficult to control and can, therefore, build up on surfaces in a manner which hinders final processing.

In addition, plasmas typically contain different ion and neutral species. To perform a particular process it would be desirable to maximize a particular species and to minimize another species within the plasma. It would also be advantageous to have a method for providing greater control over the composition of the plasma as compared to current methods.

Thus, there is a need for a method for controlling the ion composition and density of a plasma to maximize the presence of desired ion species, and to minimize the presence of undesired ion species and neutrals for doping applications. For other applications, such as etching and deposition, the reverse may be preferred where neutrals are preferred.

SUMMARY OF THE INVENTION

The performance of plasma processing tools depends on the composition of the plasmas involved. The disclosed method enables a user to control the plasma composition (including ion and neutral (i.e., radical) species, the excitation state of those species, and the electron energy distribution) and density by modifying the energy distribution of the electrons present in the plasma. Energetic electrons are produced in the plasma by accelerating some of the electrons using one or more very fast electric-field ("E-field") pulses. The pulses are long enough to influence the electrons, but too short to affect the ions significantly due to their relatively greater mass. Collisions between the energetic electrons and the constituents of the plasma result in changes in the plasma composition. By carefully controlling the electron energy, the plasma composition can be optimized to meet the requirements of the specific process being used. In some embodiments this entails modifying the ratio of ion species in the plasma, changing the ratio of ionization to dissociation, or changing the excited state population of the plasma.

In some embodiments, the method can be used during plasma implantation (i.e., doping) to achieve a higher ionization to dissociation ratio of the molecules in the gas than that are obtainable using current methods. This can lead to higher plasma density, and to less deposition on the substrate being treated.

The very fast E-field pulse can be applied to an electrically insulated surface facing the plasma. For example, the surface may be a baffle or a substrate being implanted. The E-field pulse may have a rise time that is substantially equal to or less than the inverse of the plasma (electron) frequency, while the pulse width may be much shorter than the ion transit time in the plasma sheath. The electrons subject to the applied fast rise E-field gain energy and travel through the plasma, ionizing, exciting, or dissociating the gas molecules in their path. The number of ionizations, excitation, dissociation, etc. that each electron produces will depend on the electron's energy (acquired from the E-field pulse), the gas density, and the electron/molecule collision cross section for a particular process.

A method for modifying a sub-atmospheric pressure plasma is disclosed, comprising: providing a feed gas to a chamber; exciting the feed gas to generate a plasma; and applying an electric field pulse to the plasma. The pulse can have a rise time substantially equal to or less than the inverse of the electron plasma frequency. The pulse can also have a duration of less than the inverse of the ion plasma frequency; wherein the electric field pulse selectively affects the electrons of the plasma but does not substantially affect ions of the plasma; and wherein the affected electrons modify the composition, density, and temperature of the ions and neutrals in the plasma.

A method for modifying a sub-atmospheric pressure plasma is disclosed, comprising: providing a feed gas to a chamber; exciting the feed gas to generate a plasma; and applying an electric field pulse to the plasma. The pulse may have a rise time substantially equal to or less than the inverse of the electron plasma frequency. The pulse may also have a duration of less than the inverse of the ion plasma frequency, wherein the electric field pulse selectively affects the electrons of the plasma but does not substantially affect ions of the plasma; and wherein controlling at least one of the pulse rise time, the pulse duration, and the pulse amplitude modifies the composition, density, and temperature of the ions and neutrals in the plasma through the control of the electron density and energy distribution.

A method for adjusting a plasma is disclosed, comprising: applying an electric field pulse to the plasma. The pulse can have a rise time substantially equal to or less than the inverse of the electron plasma frequency. The pulse can also have a duration of less than the inverse of the ion plasma frequency; wherein the electric field pulse selectively affects the electrons of the plasma but does not substantially affect ions of the plasma.

A method for adjusting a plasma is disclosed, comprising: applying a continuous electromagnetic wave pulse to the plasma, the pulse comprising electric fields of non oscillating polarity and with frequencies greater than or equal to the electron plasma frequency. The pulse may have a rise time substantially equal to or less than the inverse of the electron plasma frequency. The pulse may also have a duration of less than the inverse of the ion plasma frequency; wherein the electromagnetic wave pulse selectively affects the electrons of the plasma but does not substantially affect ions of the plasma.

A plasma doping system is disclosed, comprising a chamber; a baffle supported within the chamber, the baffle being insulated from the chamber; and a pulse generator connected to the baffle via a high voltage feed. The pulse generator is configured to deliver an electric field pulse to the plasma contained in the chamber, the pulse having a rise time substantially equal to or less than the inverse of the electron plasma frequency, the pulse having a duration of less than the inverse of the ion plasma frequency.

BRIEF DESCRIPTION OF THE DRAWINGS

The accompanying drawings illustrate preferred embodiments of the disclosed method so far devised for the practical application of the principles thereof, and in which.

DESCRIPTION OF EMBODIMENTS

Figure 1A:
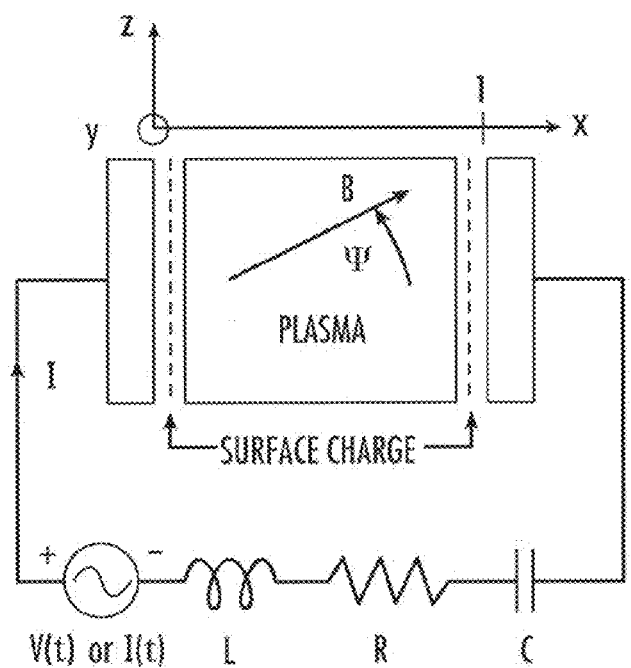
FIG. 1A is block diagram of a 1-dimensional Particle-In-Cell (PIC) plasma simulation, with external circuitry.

A method is disclosed for modifying the ion/neutral composition in a plasma source. The disclosed method may be implemented with ion sources in general, and in particular the disclosed method may be used with sources such as indirectly heated cathode (IHC) sources, Bernas sources, and plasma doping (PLAD), plasma etching, plasma deposition/PVD.

The method may be used to alter/increase the average electron temperature/energy in a plasma, which consequently alters the probability of electron impact processes (ionization, dissociation, excitation).

In plasmas, it is desirable to have the ability to selectively modify the ion and radical composition to increase the concentration of desired particle types and decrease the concentration of undesired particle types. By using a nanosecond (ns) E-field pulser, electron energy can be selectively modified, which, in turn, can result in a modification of the ion composition of the plasma. Applications of the disclosed method include any plasma source application for which it is desirable to control the ion and/or neutral composition, density, temperature and also the density and energy distribution of electrons. A non-limiting exemplary list of such applications include, but are not limited to: (1) High molecular weight ion sources; for instance, carborane, decaborane, octadecaborane; (2) Silicon-on-Insulator (SOI) processes involving $H_2$ ion sources; and (3) Plasma Doping (PLAD) applications.

The disclosed method includes applying an E-field pulse to a plasma. In the simulation, the E-field pulse lasts only a few ns, and has a rise time of ~1 ns, with the result being that an electric field is produced in the entire plasma, not just in the plasma sheath. This E-field drives an increase in electron energy. Due to the small time scale involved (ns), only the electrons in the plasma are influenced by the electric field, while the relatively heavy ions are not. This makes it possible to control electron energy separately from the ions of the plasma.

From conventional wisdom, it is usually not possible to sustain an electric field across a plasma. This, however, is true only for time scales greater than the inverse of the plasma or electron frequency, which is given by:

$$\omega_{pe} = \sqrt{\frac{q^2 n_e}{m_e \varepsilon_o}} \approx 9000\sqrt{n_e(\text{cm}^{-3})}\text{ Hz}$$

where $\omega_{pe}$ is plasma or electron frequency, q is the electric charge, $n_e$ is electron density, $m_e$ is electron mass, and $\varepsilon_0$ is permittivity in free space. For $n_e=10^{10}$ cm$^{-3}$, $\omega_{pe}\approx 0.9$ GHz $\Rightarrow \tau_e=1.1$ ns, where $\tau_e$ is the electron response time.

For situations in which an E-field pulse of larger than about 1.1 ns is applied to a plasma, the electrons respond almost immediately to the pulse thereby altering the sheath to accommodate the applied bias. This drop in voltage across the sheath is what actively prevents an electric field across the plasma.

However, when the rise in the magnitude of the E-field pulse is faster than the electron response time $\tau_e$ (i.e., wherein a nano-second or a sub-nano-sec pulse is used), an electric field can be established across the plasma, albeit for a short period. This is because the electrons are immersed in an electric field because the E-field is created before the electrons have enough time to respond (i.e., sub-ns).

To confirm this, the inventors developed a 1-dimensional Particle-In-Cell (PIC) plasma simulation of the scenario using plasma device code XPDP1 (device code available from http://ptsg.eecs.berkeley.edu/). A block diagram of the model along with external circuitry is shown in FIG. 1A. The results are given below.

Input conditions for the PIC Simulation were as follows:
Electron density, $n_e=10^{10}$ cm$^{-3}$
Electron temperature, $T_e=4$ eV
Length of chamber, L–0.3 m Number of spatial cells 10,000
Cell width=0.3 μm
Time step=$10^{-12}$ s
100,000 computer particles
Pressure=1 mTorr L, R and C are the inductance, resistance and capacitance associated with the external circuit for the XPDP1 simulation. In this case, a voltage pulse to create the E-field, though other methods may be used to produce the same E-field.

Figure 1B:
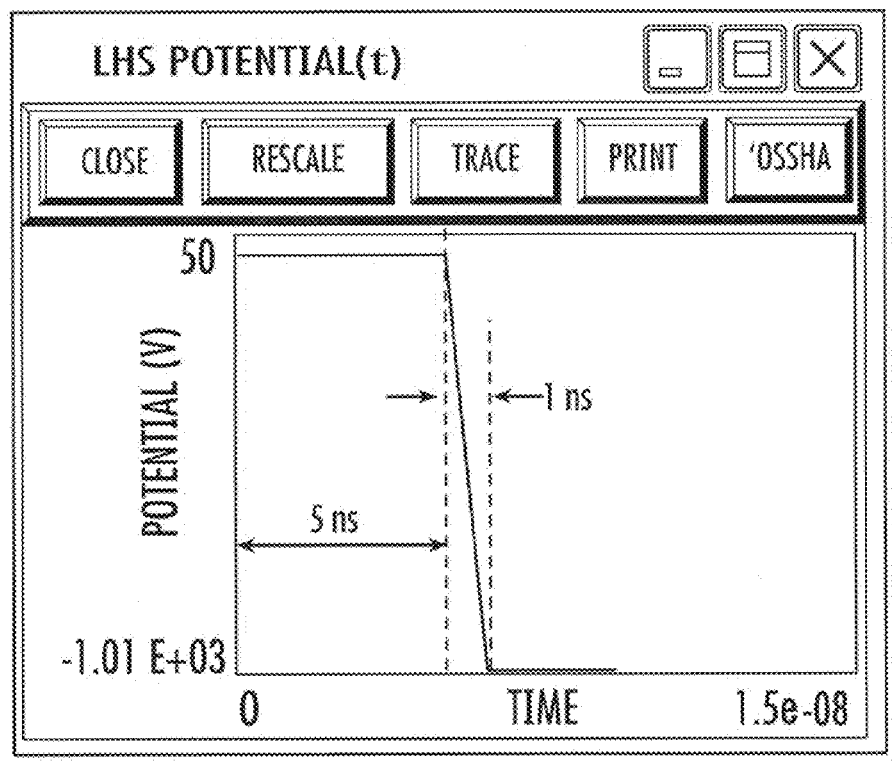
FIG. 1B is a graphical illustration of an input voltage nanopulse.

XPDP1, the 1-dimensional PIC Simulation Solver was run for 5 ns (with no bias) prior to the nano-sec pulse to allow for the sheath to form and to achieve equilibrium (i.e., a stable plasma condition). The input voltage nano-pulse is shown in FIG. 1B, in which a negative voltage pulse of about $-1.1 \times 10^3$ V was applied over a period of about 1 ns.

In FIGS. 2-8, snapshots of the distribution of the left-hand side electrode (LHS—the voltage on the left hand side electrode of the plasma reactor used in the simulation) potential 10, potential across the plasma 20, electric field across the plasma 30, electron energy distribution function (EEDF) 40—a representation of the distribution of electrons vs. their energy within the plasma, and electron velocity (in the x-direction) 40, are shown over the entire simulation period.

Figure 2:
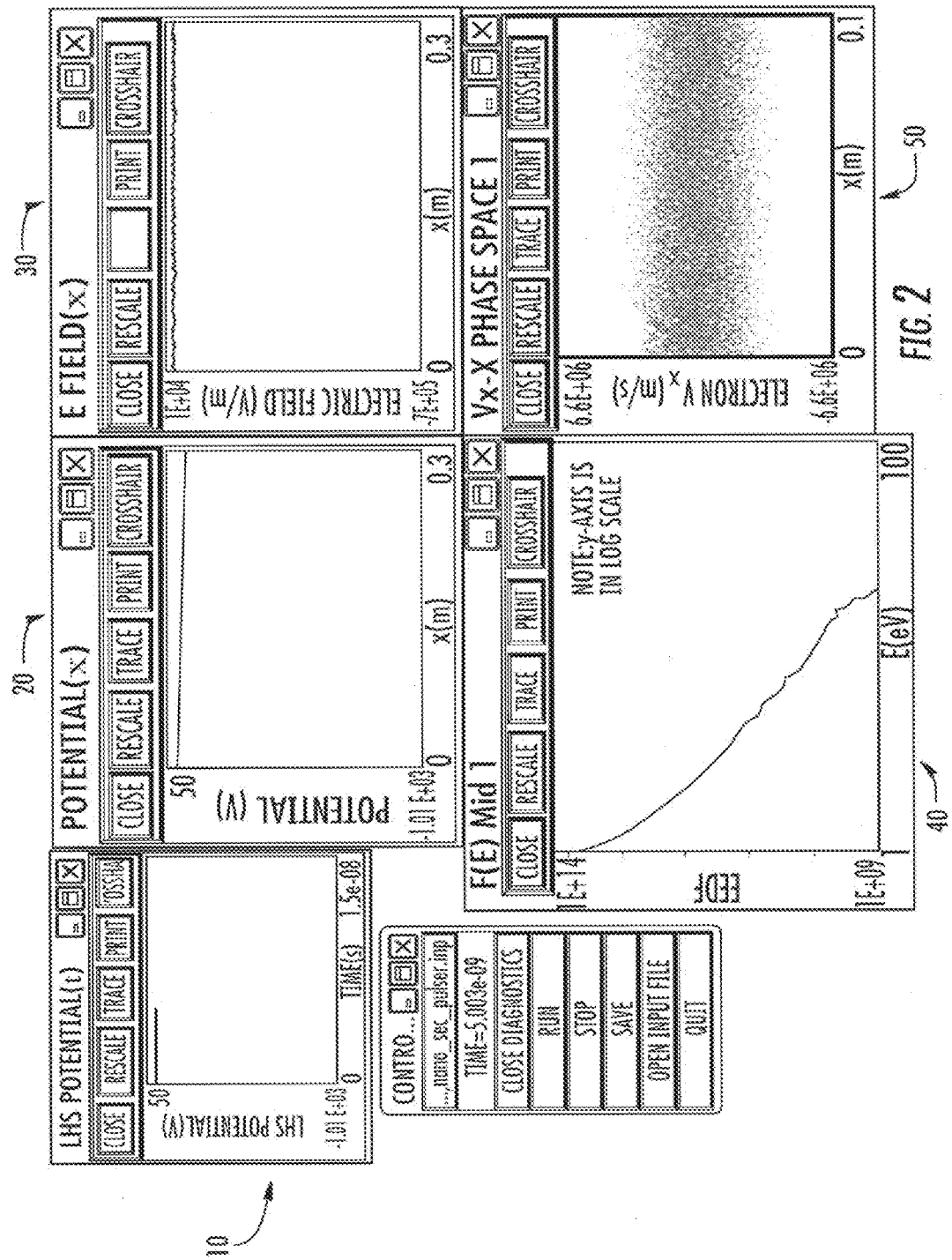
FIG. 2 is a series of graphical illustration of the left hand side (LHS) potential, potential across the plasma, electric field across the plasma, electron energy distribution function, and electron velocity, simulated using the PIC plasma simulation of FIG. 1A, prior to the start of the voltage pulse.

FIG. 2 shows the plasma properties before the start of the voltage pulse. As can be seen from the potential 20, the plasma potential has stabilized (i.e., the lines representing potential 20, and electric field 30 are shown as flat).

Figure 3:
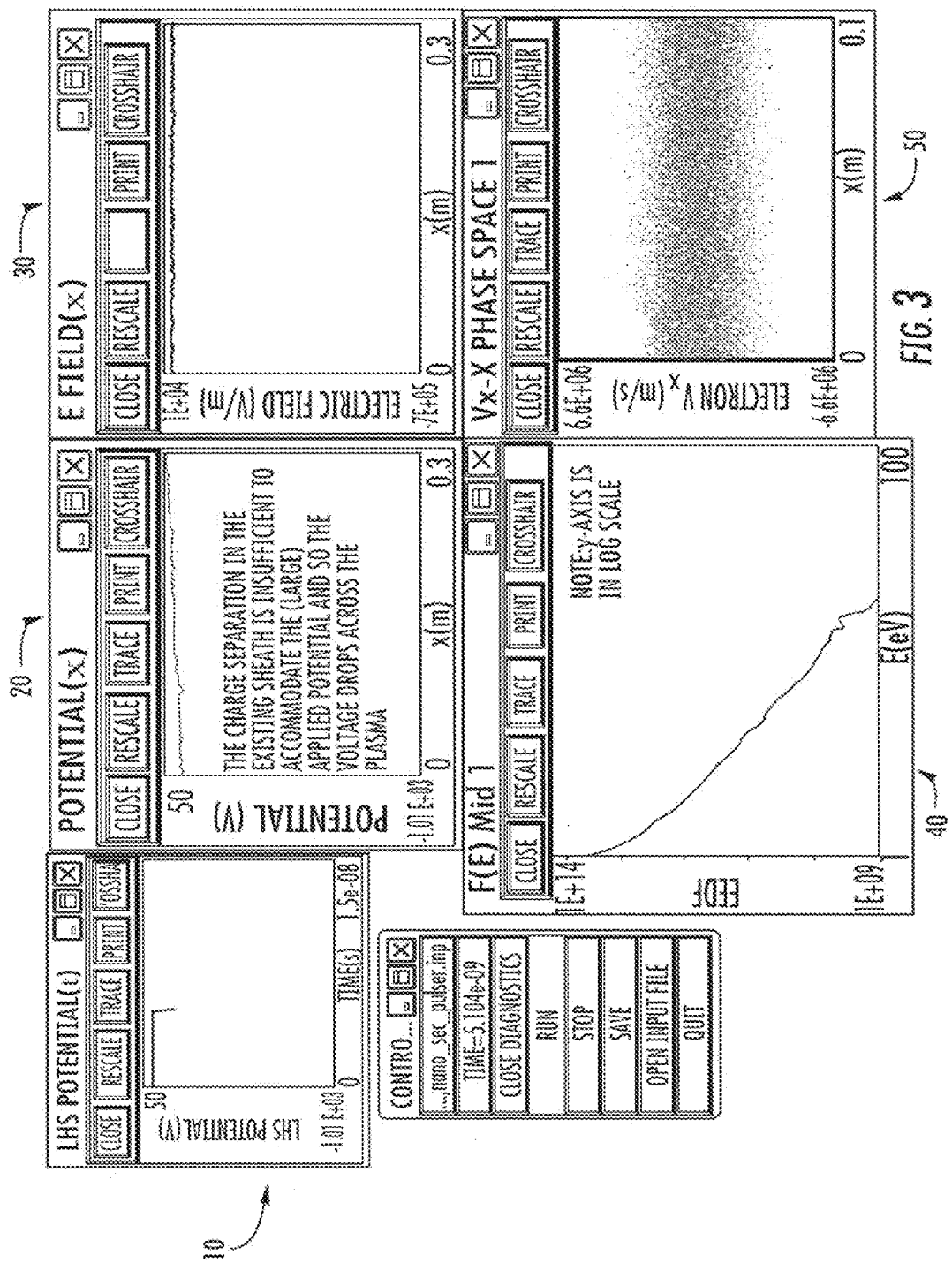
FIG. 3 is a series of graphical illustrations of the measures described in FIG. 2, at 0.1 nanoseconds into the voltage pulse.
Figure 4:
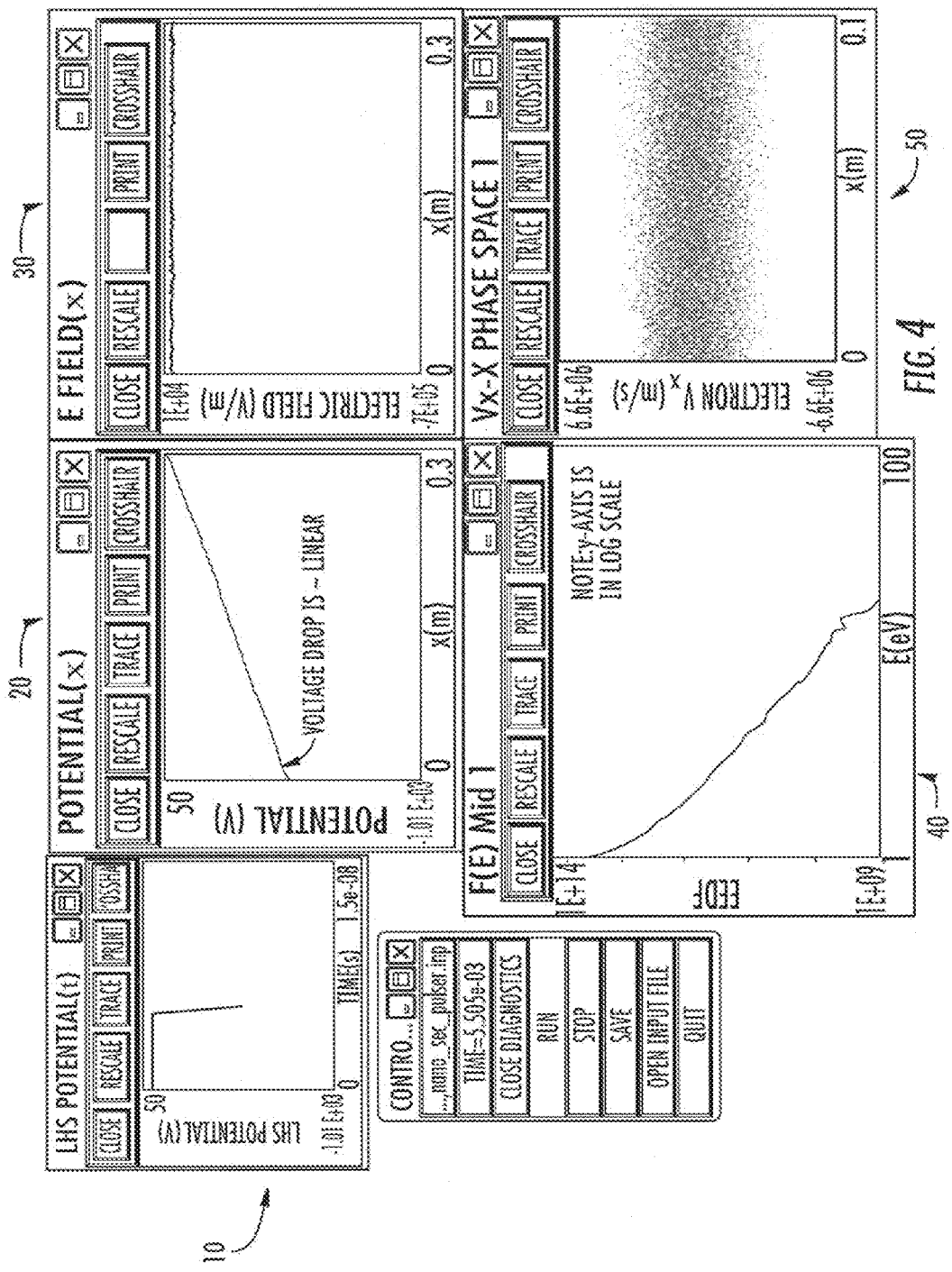
FIG. 4 is a series of graphical illustrations of the measures described in FIG. 2, at 0.5 nanoseconds into the voltage pulse.
Figure 5:
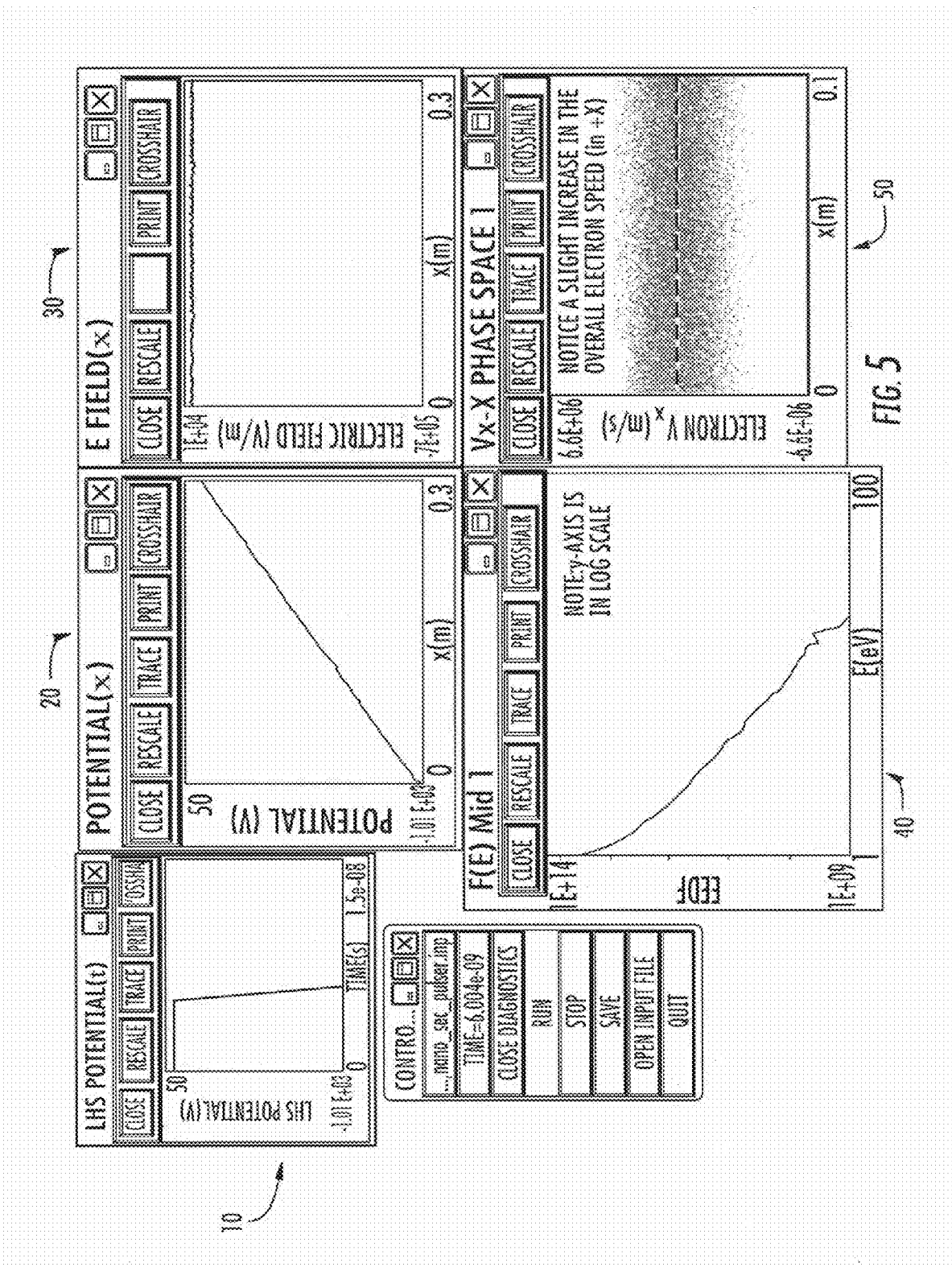
FIG. 5 is a series of graphical illustrations of the measures described in FIG. 2, at the endpoint of the rise of the voltage pulse.

FIG. 3 shows the plasma properties 0.1 ns into the rise time of the voltage pulse. The voltage pulse can be seen as a downward turn in the LHS potential 10. Also, a slight voltage drop (potential 20) across the plasma can be seen. The rise in voltage is rapid (compared to the electron response time, $\tau_e$) and the sheath is incapable of accommodating the voltage drop due to the sudden rise in the potential of the adjoining electrode. Hence, the voltage drop (potential) across the plasma is represented by:

$$\nabla^2 V = -\frac{\rho}{\varepsilon_o} = 0 \{ \because \rho = 0 \}$$
$$\Rightarrow V = \alpha x + \beta \{\alpha, \beta \text{ are constants}\}$$

where V=potential; ρ=net density of charged species, and $\varepsilon_0$=permittivity From this it can be concluded that the voltage variation (potential 20) should be linear across the plasma. This is shown in FIG. 4, which are snapshots of the plasma properties at 0.5 us into the rise time of the voltage pulse.

Figure 6:
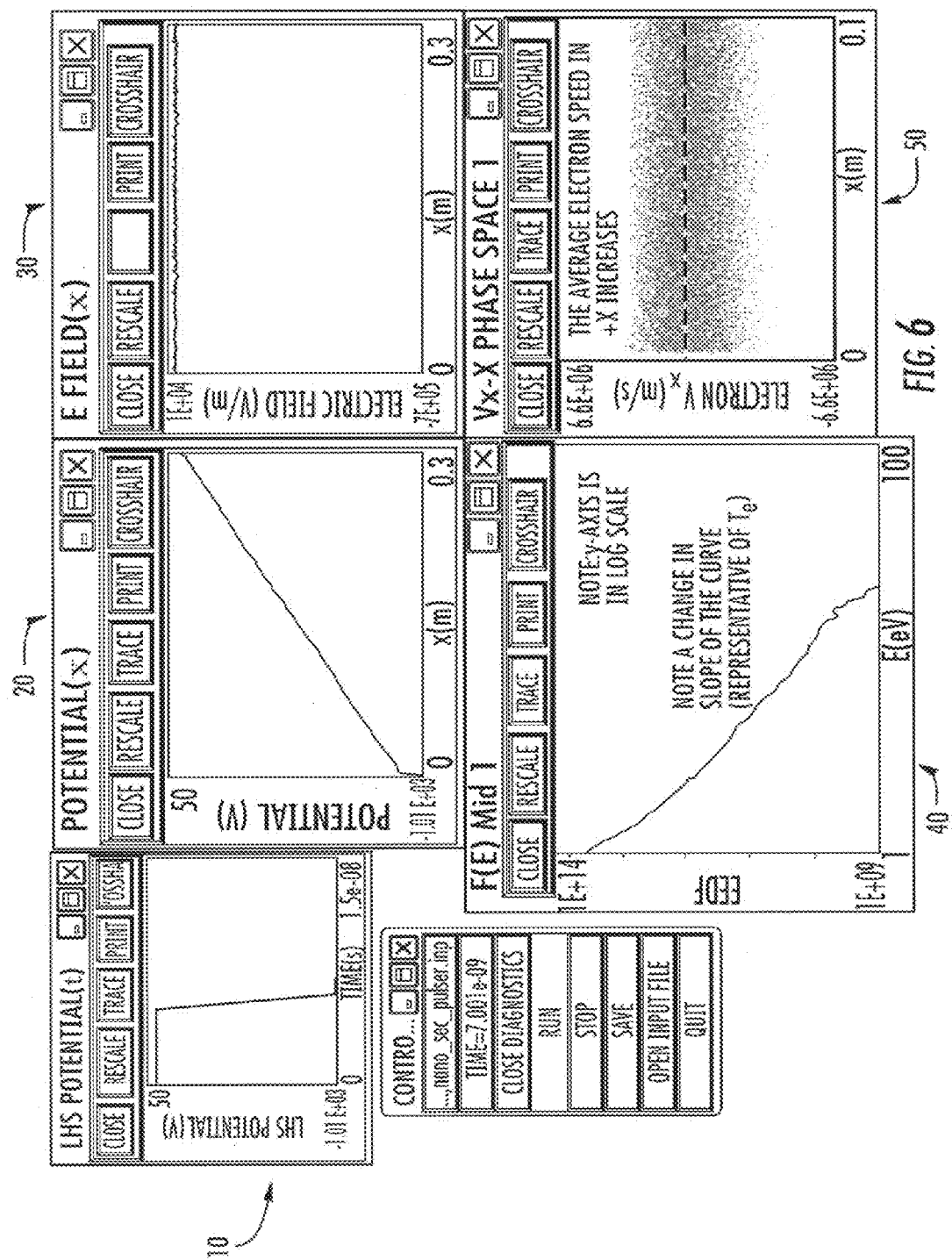
FIG. 6 is a series of graphical illustrations of the measures described in FIG. 2, after the rise of the voltage pulse is complete.
Figure 7:
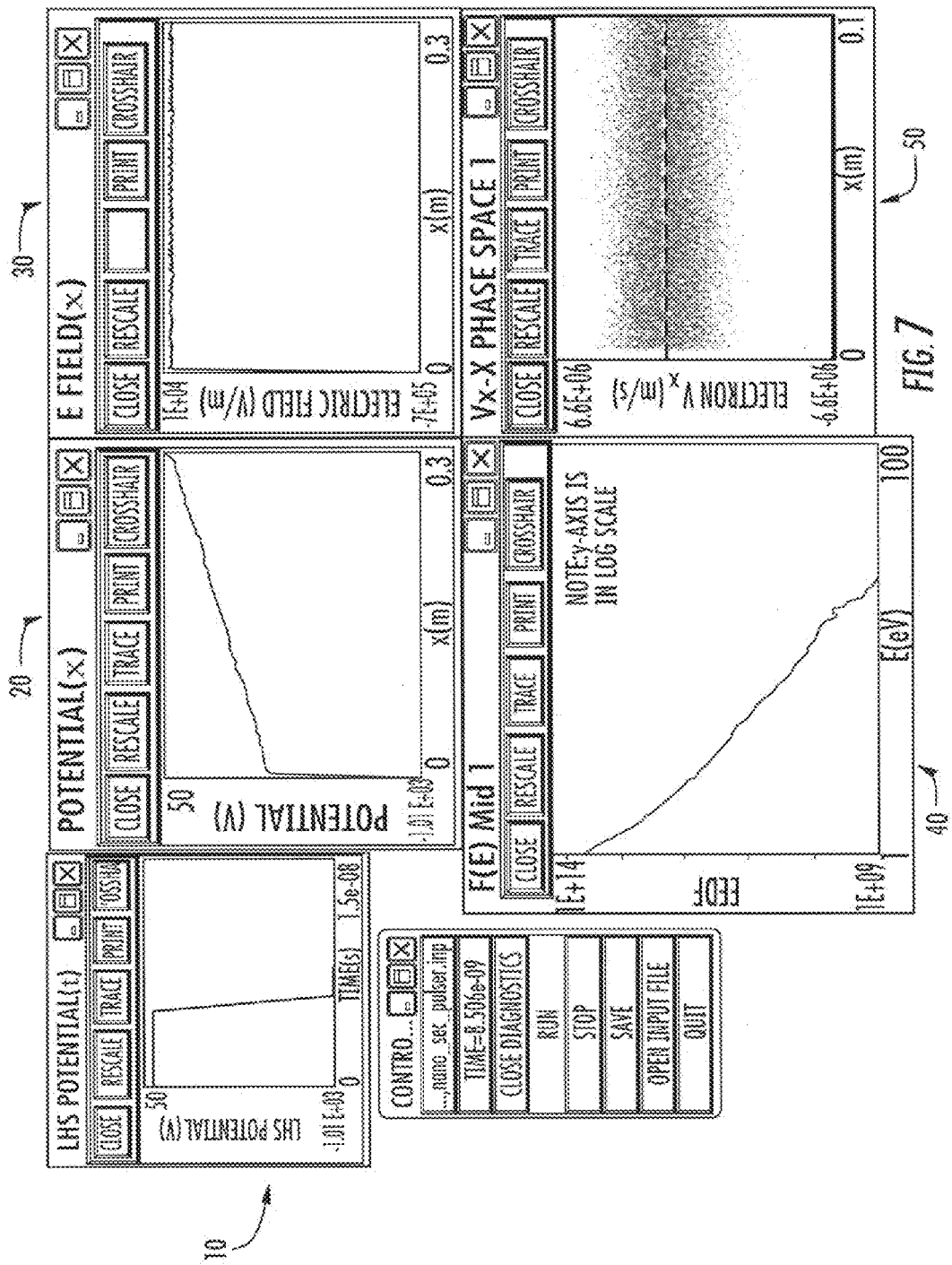
FIG. 7 is a series of graphical illustrations of the measures described in FIG. 2, at 3.5 nanoseconds after the start of the voltage pulse.

Even when the voltage pulse has risen to its maximum absolute magnitude (see LHS potential 10 and potential 20), which in this case corresponds to its value at t=6 ns (1 ns after the start of the voltage pulse; see FIG. 5), the applied voltage is shown still to be dropped across the entire plasma. As previously noted, this voltage drop is due to the fact that the electrons have insufficient time to respond to the pulse As shown in FIG. 6, which represents t=7 ns, the electrons have responded to the electric field. The result is an increased charge separation near the walls of the chamber and consequently a thicker sheath. Subsequently the voltage drop across the entire plasma is slowly accommodated by the growing sheath. FIG. 7 shows plasma properties at t=8.5 ns, which is 2.5 ns after the start of the constant voltage pulse. It will be observed that the average electron speed 50 has increased—average is more positive than in FIGS. 2-6.

Figure 8:
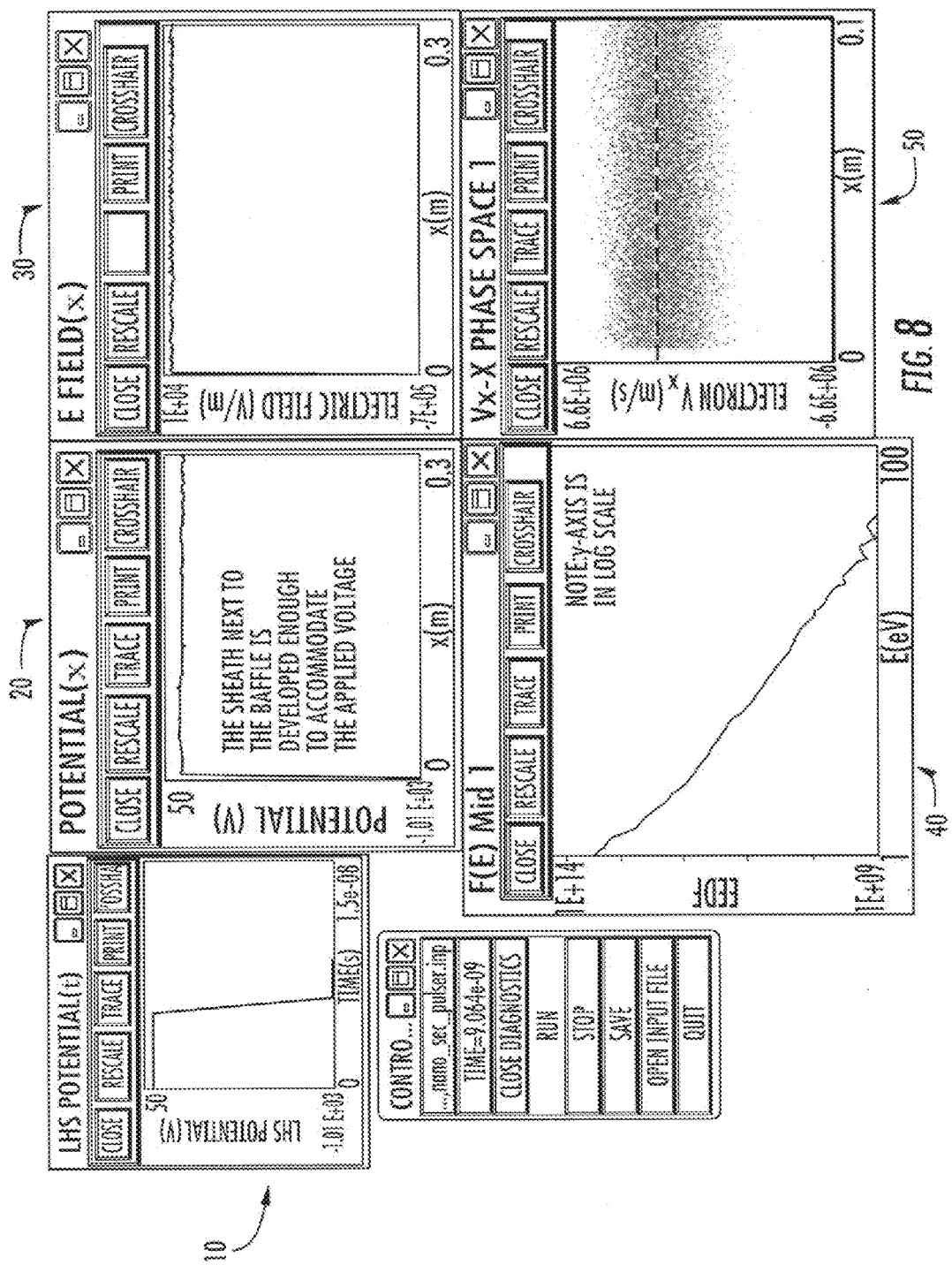
FIG. 8 is a series of graphical illustrations of the measures described in FIG. 2, at 4 nanoseconds after the start of the voltage pulse.
Figure 9:
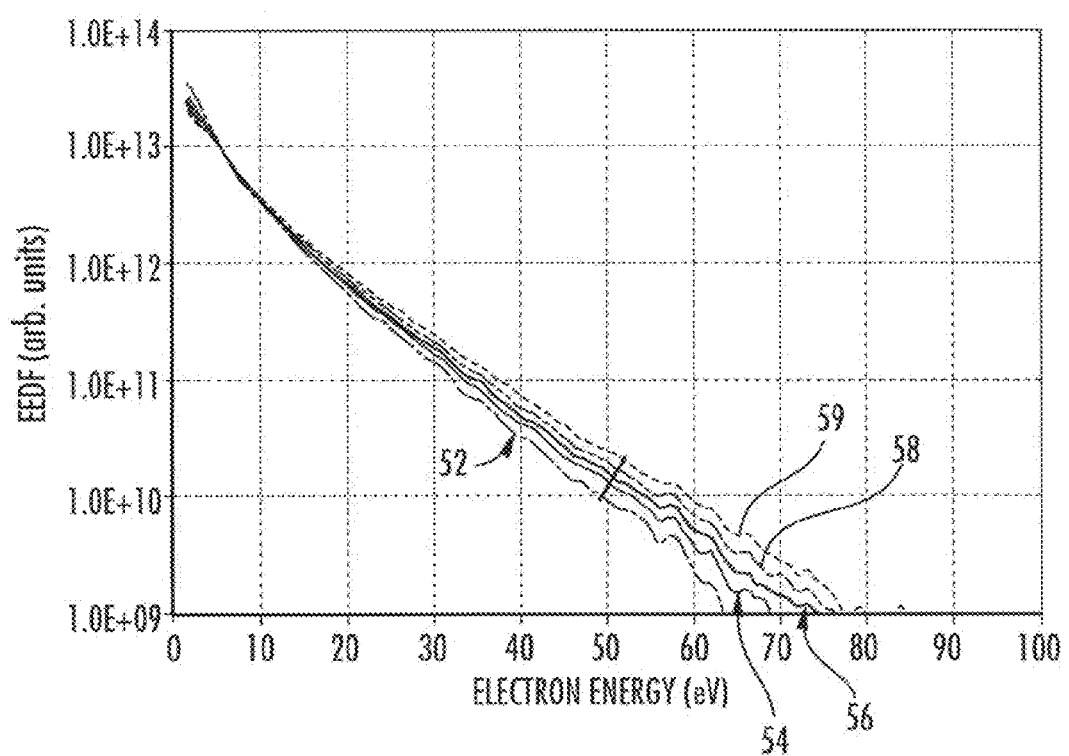
FIG. 9 is a graph of Electron Energy Distribution Function (EEDF) vs. electron energy.

Referring now to FIG. 8, plasma properties are shown at t=9 ns, which is 3.0 ns after the start of the constant voltage pulse. Again, it will be observed that the average electron speed 50 continues to increase. The EEDF 40 is also noticeably steeper as is evident from FIG. 9, which is a graph of electron energy distribution function (EEDF) (log–scale) vs. electron energy (eV). Curve 52 represents electron energy conditions in the plasma at t=6 ns (i.e., 1 ns after the start of the voltage pulse), curve 54 represents t=7 ns, curve 56 represents t=8 ns, curve 58 represents t=9 ns, and curve 59 represents t=10 ns.

As the figures illustrate, it is possible to modify, using nano-/sub-nano-second eE-field pulses, the EEDF in plasmas. Consequently, it would also be possible to modify the ion/neutral composition, density and temperature in plasmas, for these parameters are related to the EEDF.

Example 1

Figure 10:
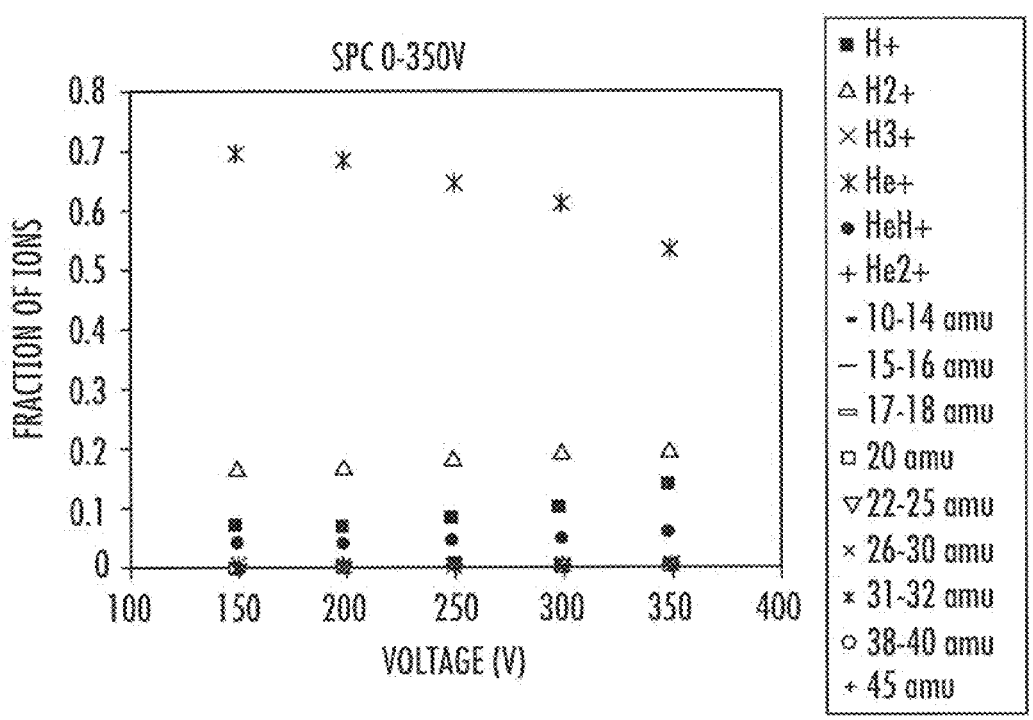
FIG. 10 is a graph of the variation in ion fractionation as a function of peak applied voltage on the nano-pulser.

In the following, results from experiments performed on a plasma doping (PLAD) tool are presented. Referring to FIG. 10, variation in ion fractionation is illustrated as a function of peak applied voltage on the nano-pulser. Fractionation refers to which ion is being made in the plasma (i.e., if you take diborane, you might be making $B_2H_5^+$, or $B_2H_4^+$). It can be seen from FIG. 10 that, for example, as the voltage pulse increases in magnitude (as applied on the nano-pulser), the relative fraction of $He^+$ ions (i.e., the concentration) goes down, while the $H^+$ concentration (among others) goes up. Thus, by varying the voltage of the nano-pulser, the user can tailor the production of ions of interest to suit a particular process.

Figure 11:
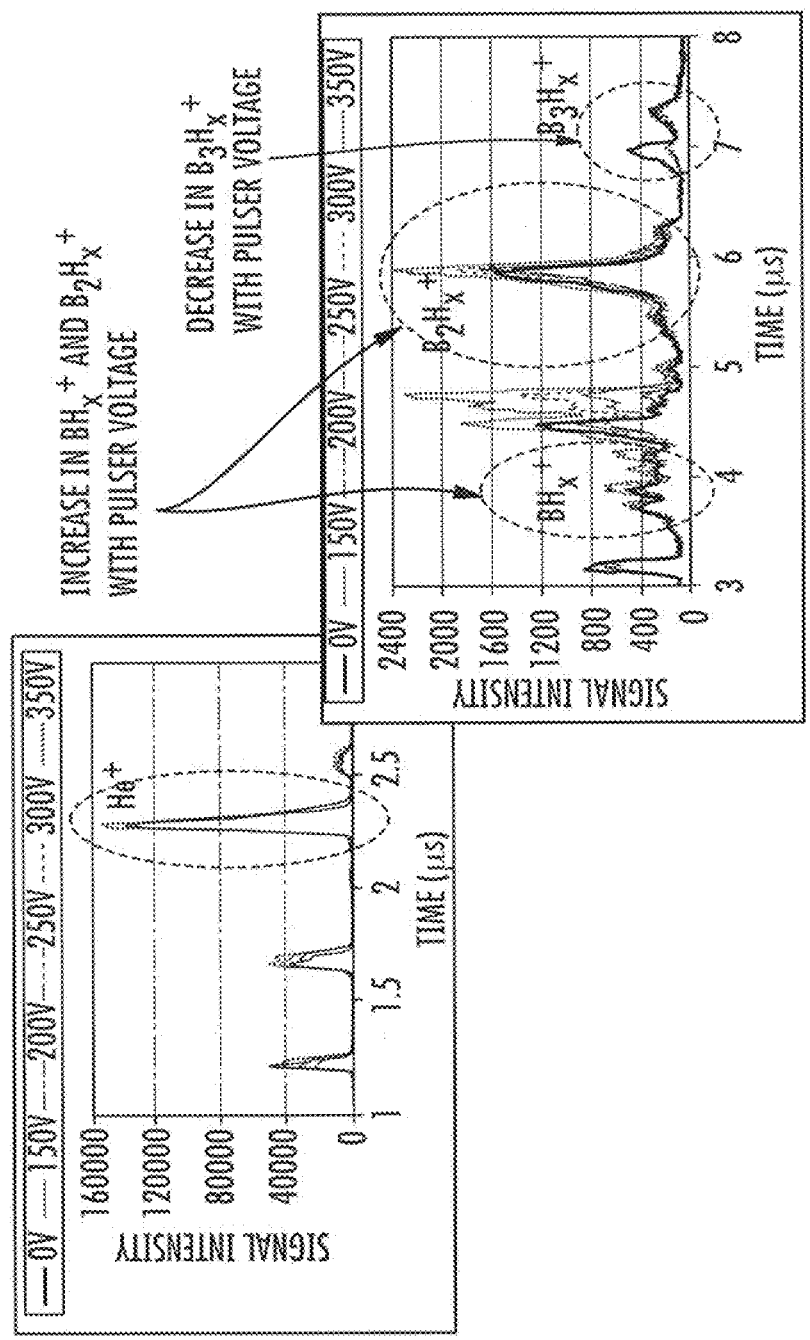
FIG. 11 is a graph of time-of-flight (TOP) spectra for 0.1% $B_2H_6$ (in He) plasma as a function of nano-pulser voltage.

FIG. 11 illustrates the effect that changes in the pulse voltage has on produced ion concentration. FIG. 11 is a graph of time-of-flight (TOF) spectra for 0.1% $B_2H_6$ (in He) plasma as a function of pulser voltage. In this illustration, the production of $He^+$ and $B_xH_y$ fractions can be seen to change with pulser voltage. For $B_3H_x^+$, it can be seen that an increase in pulser voltage causes a decrease in ion concentration, whereas for $BH_x^+$ and $B_2H_x^+$, an increase in pulser voltage causes an increase in ion concentration. Thus, by adjusting the pulser voltage, further refinement of ion concentration can be achieved.

Figure 12:
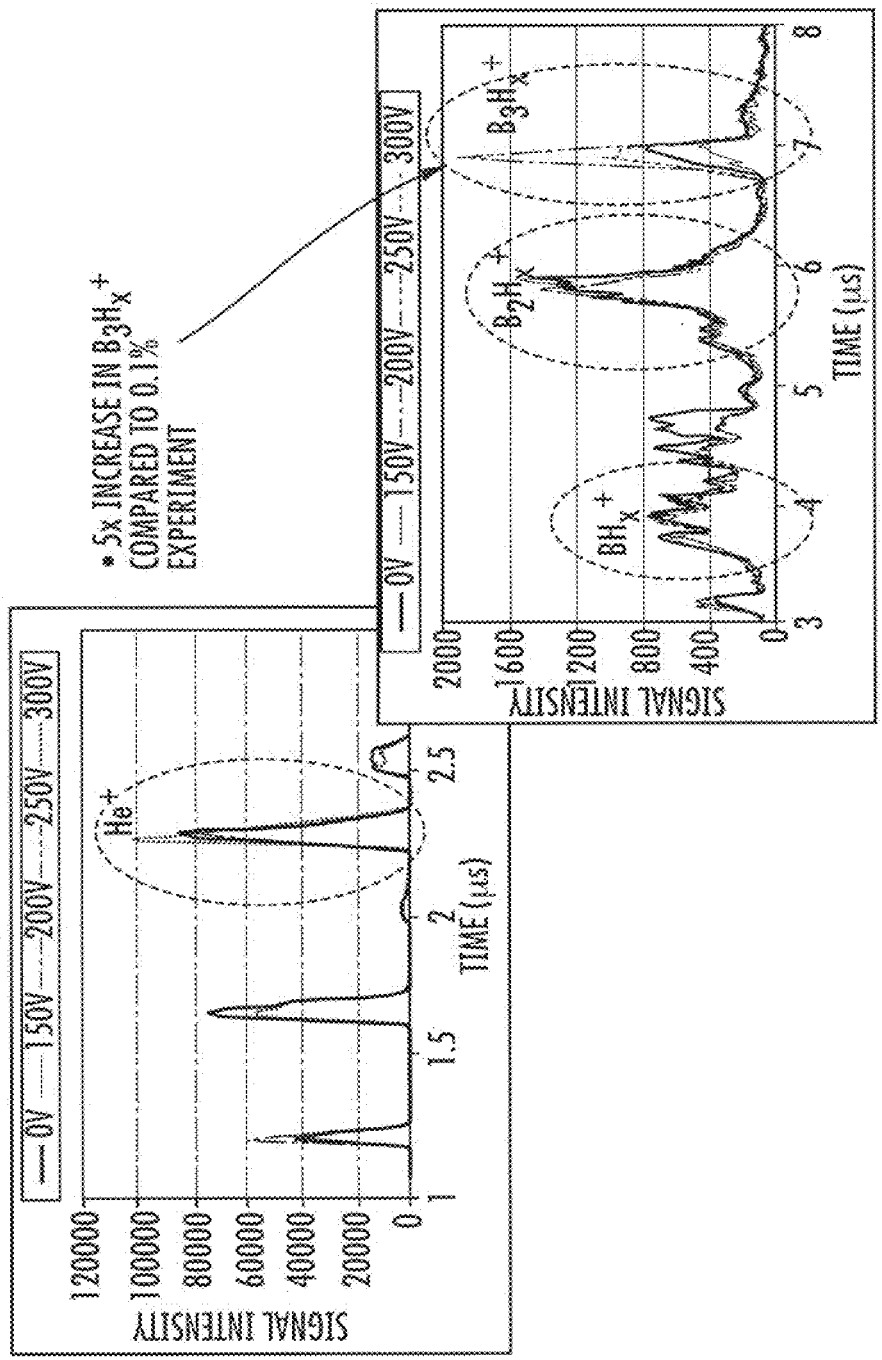
FIG. 12 is a graph of TOF spectra for 0.5% $B_2H_6$ (in He) plasma as a function of nano-pulser voltage.

FIG. 12 illustrates how a change in the concentration of diborane ($B_2H_6$) in the plasma can affect the ion concentrations produced using the voltage pulse. FIG. 12 is a graph of TOF spectra for 0.5% $B_2H_6$ (in He) plasma as a function of pulser voltage. The only differences between FIGS. 11 and 12 is the difference in diborane concentration (0.5% in FIG. 12, vs. 0.1% in FIG. 11). It can be seen that by changing the diborane concentration, the effect of the nano-pulser is different. Specifically, a 5× increase in $B_3H_x^+$ concentration is achieved as compared to the $B_3H_x^+$ peak of FIG. 11).

Figure 13:
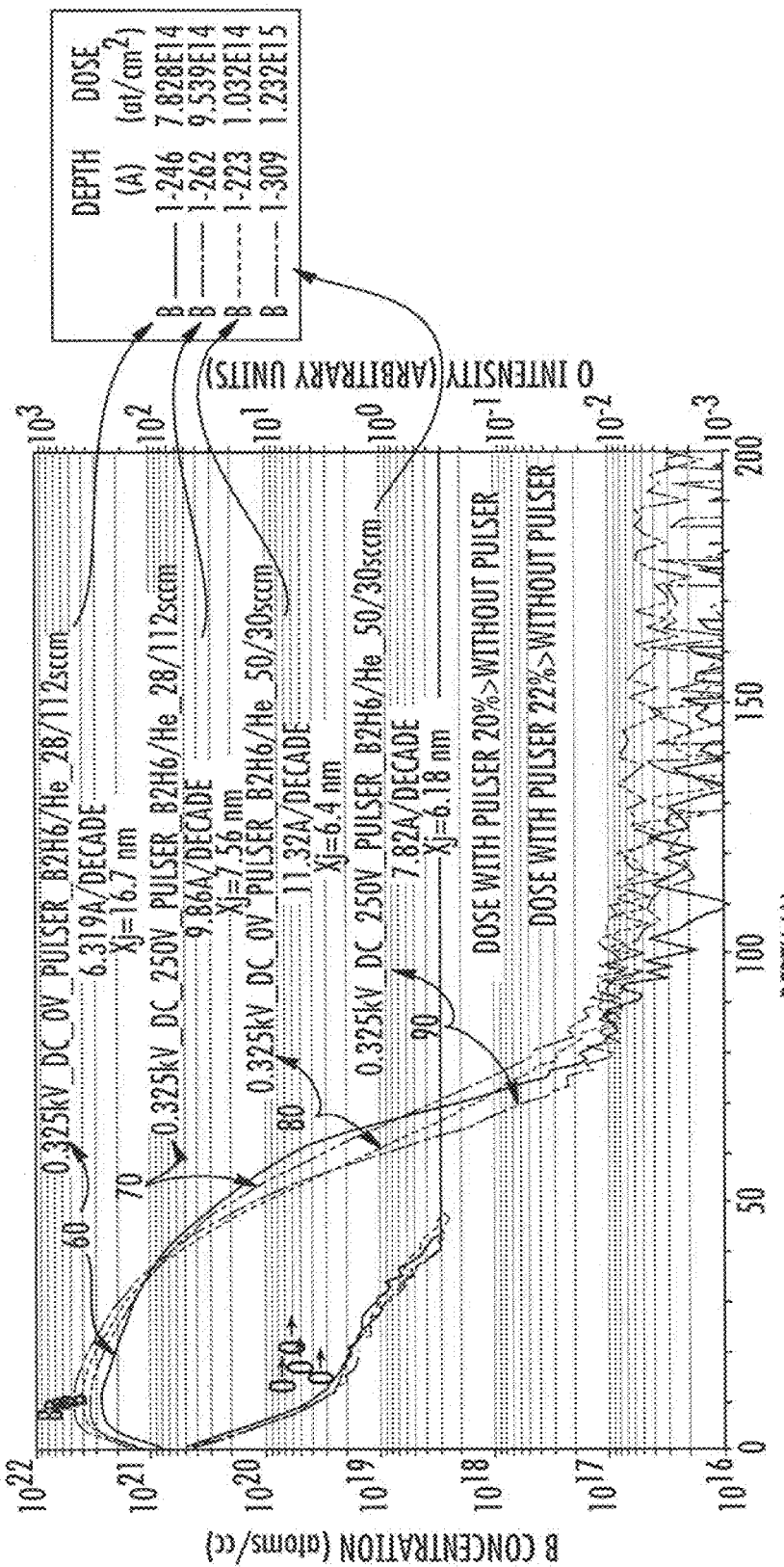
FIG. 13 are SIMS profiles of the variation of Boron concentration as a function of depth below the surface of a silicon substrate.

FIG. 13 shows SIMS profiles of the variation of Boron concentration as a function of depth below the surface of a silicon substrate. From the profiles, with pulser (curves 70, 90) the net dose increased by ~20% over similar implants performed using the same plasma concentration but without the voltage pulse (curves 60, 80). Thus, curves 60 and 70 are SIMS profiles achieved using a plasma having a 0.1% diborane concentration and a wafer bias of 0.325 kV. Curve 70, however, shows implant dosage achieved using a 250 V nanopulse, while curve 60 shows implant dosage achieved without a nanopulse. From this it can be concluded that a higher concentration at a greater depth is achievable using the disclosed method. The inventors believe this to be a consequence of increased ion density produced in the plasma using the disclosed voltage pulse method, and also an increased density of $B_2H_x^+$ and $B_3H_x^+$. FIG. 13 shows a comparison of SIMS profiles for cases with and without pulser.

Similarly, curves 80 and 90 are SIMS profiles achieved using a plasma having a 0.5% diborane concentration and a wafer bias of 0.325 kV. Curve 90, however, shows implant dosage achieved using a 250V nano-pulse, while curve 80 shows implant dosage achieved without a nanopulse. Again, from these results it can be concluded that a higher ion concentration at a greater depth is achievable using the disclosed method. In addition, a change in diborane composition can also be used to affect this concentration. The nano-pulse changes the composition of the plasma, leading to different chemistries in the plasma and a change in the implant mechanism.

The illustrated results reveal that it is possible to modify an implant profile using the disclosed nanopulse method, with or without a change in the concentration of diborane in the plasma.

Figure 14:
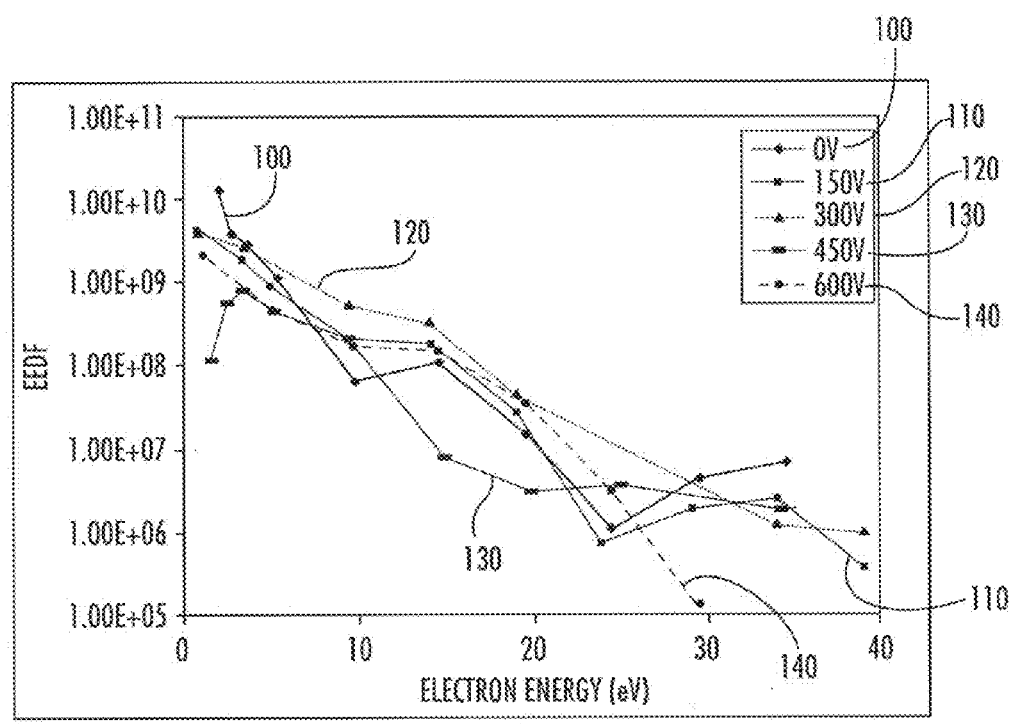
FIG. 14 is graph is a log plot of the electron energy distribution function (EEDF) vs. electron energy (eV) for different nano-pulser voltages.

FIG. 14 shows the variation of the EEDF (electron energy distribution function) as a function of pulser voltage. The FIG. 14 graph is a log plot of EEDF vs. electron energy (eV). The illustrated values were experimentally calculated using an Argon plasma, at 6 mTorr, 550 W, and a probe inserted to measure electron energy distribution. Electron energy distribution was measured for different nanopulse voltages 0V (100), 150V (110), 300V (120), 450V (130), 600V (140). As can be seen, the data (100) obtained without the nanopulse generally shows more electrons having a low energy as compared to the data (100-140) obtained with the presence of the nanopulse. The increase in the slope of the EEDF (which is representative of the electron temperature, Te) is as observed in the XPDP1 simulation.

In summary, the mean electron energy of a plasma can be altered by applying nano- or sub-nano-second voltage pulses, where the voltage pulse is faster than $\tau_e$, the electron response time. This can be achieved by either using fast rise time pulses (sub-nanosecond pulses) for high plasma densities, or moderately fast rise time pulses (nanosecond pulses) for low plasma densities (since $\tau_e \propto \sqrt{n_e}$). The E-field pulse may have a rise time that is substantially equal to or less than the inverse of the electron plasma frequency such that the amplitude of the pulse during, or at the end of, the rise time is sufficient to produce a desired modification of the average electron energy. The term "substantially equal to" in this context means that the rise time can be slightly higher than the inverse of the electron plasma frequency, as long as it remains lower than the inverse of the ion plasma frequency.

The disclosed method enables modification of the EEDF in a plasma. This may be of particular use for increasing or modifying the $H^+$ fractionation in IHC sources, a process that finds use in silicon on insulator (SOI) applications.

Figure 15:
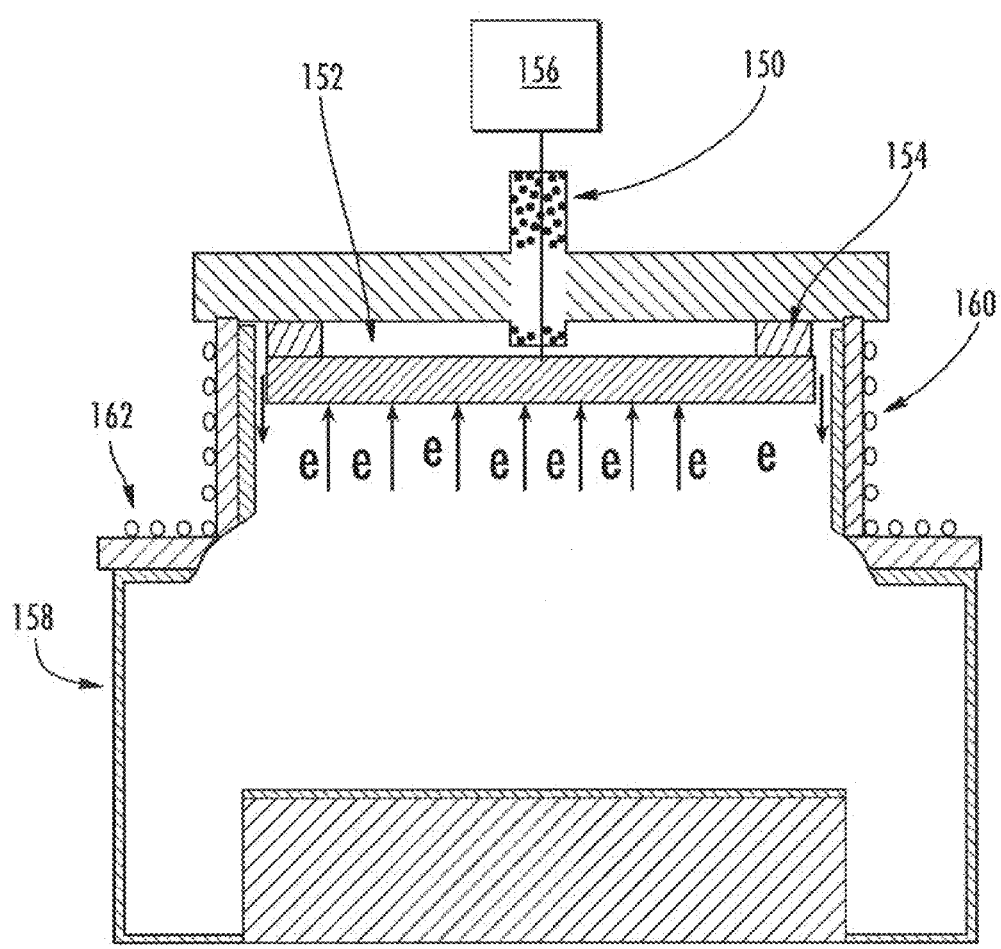
FIG. 15 is an exemplary implementation of a nano-pulser in a plasma doping (PLAD) tool.

Referring now to FIG. 15, an exemplary implementation of a fast pulse generator is illustrated in its application in a plasma doping (PLAD) tool. The nanopulse generator 150 may be connected to the baffle 152 of the PLAD tool. The baffle 152 is insulated from the ground by insulator 154 and is connected to the pulse generator 10 through a high voltage feed through 156. Plasma in the vessel 158 is created by powering the vertical 160 or horizontal 162 coils or both with RF power.

Figure 16:
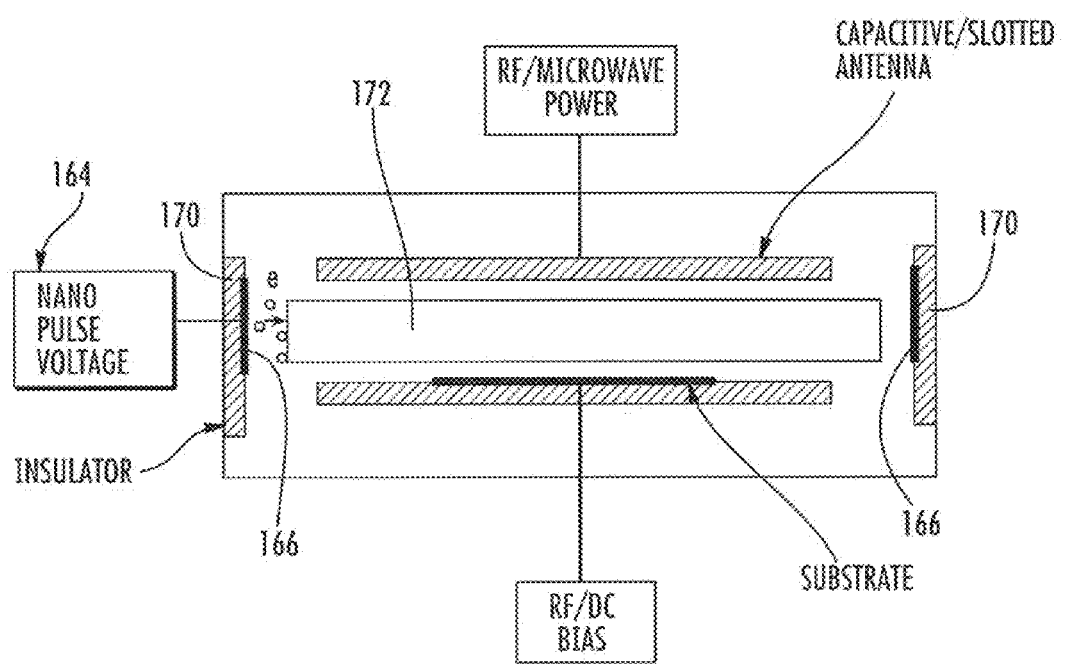
FIG. 16 is a second exemplary implementation of a nano-puller in a plasma enhanced chemical vapor deposition (PECVD) tool.

Referring now to FIG. 16, a second exemplary implementation of a fast pulse generator is illustrated in its application in a plasma enhanced chemical vapor deposition (PECVD) tool. The nanopulse generator 164 is connected to an cylindrical ring 166 positioned inside the plasma vessel 168 and is insulated from the vessel body by an insulator 170 such as quartz. A nanopulse is applied to the cylindrical ring 166 and accelerates electrons "e" present in the presheath into the plasma body 172.

Figure 17:
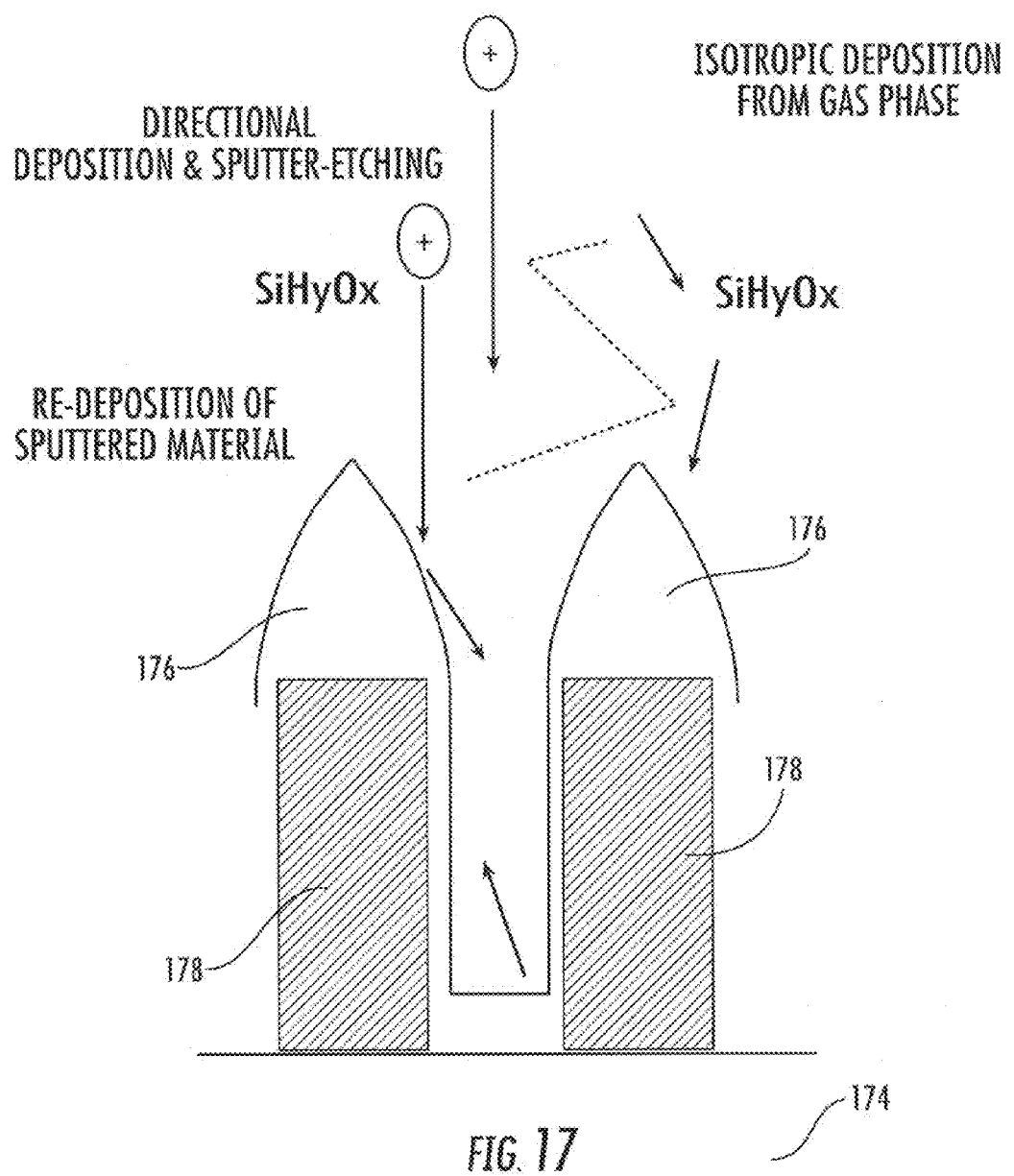
FIG. 17 is a cross-section view of buildup on and around high aspect ratio structures during PECVD.

Referring to FIG. 17, PECVD is mainly driven by neutral, ion and ion-assisted deposition on the surface of a substrate 174. Neutral driven deposition can lead to the formation of caps 176 on the entrance of high aspect ratio structures 178 (trenches or vias 180), leading to the formation of voids inside them. Because of its directionality, ion driven deposition can deposit the ionic species of interest at the bottom of the structure without clogging the entrance. Moreover, ion-assisted deposition proceeds much faster compared to other parallel pathways. Therefore, increasing ion density using the disclosed method will improve not only process performance in terms of capability to fill high aspect ratio structures, but its deposition rate as well.

The disclosed method can be used to apply a very fast pulsed voltage to a plasma to increase the ratio of ion density to neutral (i.e., radical) density in a PECVD process. In one embodiment, a fast negative voltage pulse is employed with a rise time that is less than or equal to the inverse of the plasma frequency, while the pulse width is shorter than the ion transit time in the plasma sheath. As previously described, the voltage can be applied to any insulated surface facing the plasma. The electrons subject to the applied fast rise electric field gain energy and travel through the plasma, ionizing, exciting, or dissociating the gas molecules in their path. The number of ionizations, excitation, dissociation, etc that each electron will produce depend on the electron's initial energy (acquired from the voltage pulse), the gas density, and the electron/molecule collision cross section for a particular process.

Figure 18:
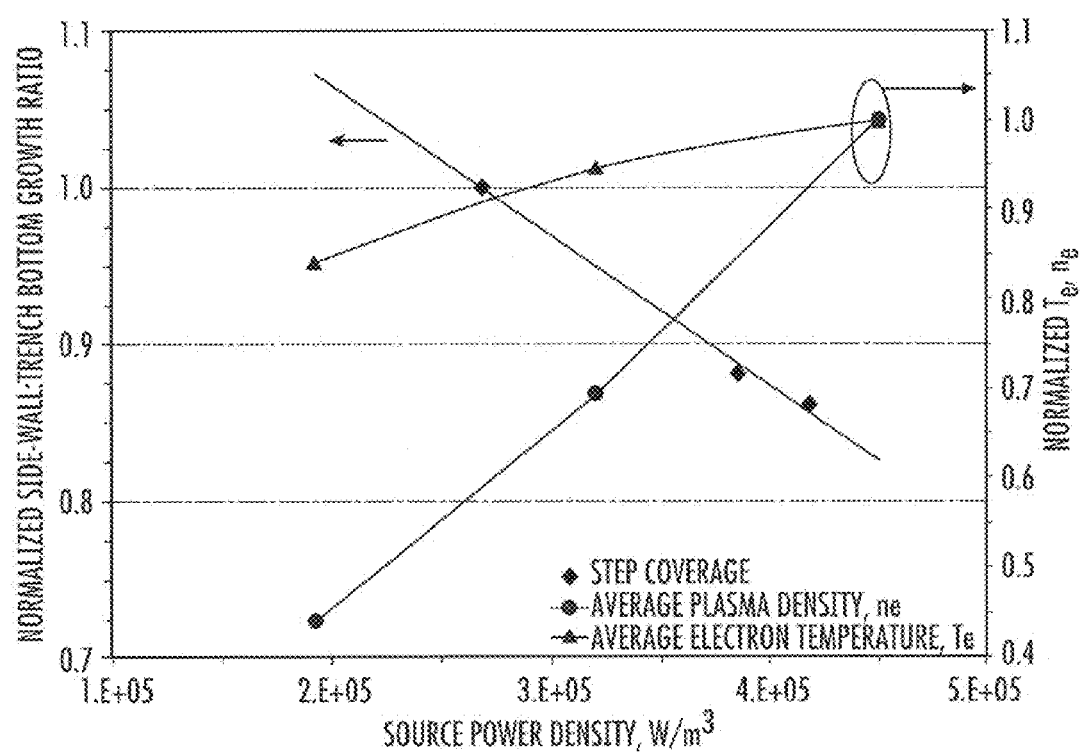
FIG. 18 is a plot of process directionality vs. plasma characteristics.

The effect of increasing plasma density on the directionality of the CVD process is shown in FIG. 18, in which process directionality (normalized side-wall: trench bottom growth ratio) is plotted against plasma characteristics. From FIG. 18, it can be seen that an increase in ion concentration in a plasma results in greater directionality, which, in turn, enhances the filling of high aspect ratio trenches/vias.

It will be appreciated that the arrangements of FIGS. 15 and 16 may include a plurality of electrodes in a plasma to which nano-/sub-nano-second pulses are applied. A combination of several electrodes with nano-/sub-nano-second pulses can produce different results than those presented here. For instance, asynchronously "nano-sec. pulsing" two electrodes facing one another with a plasma in between can result in pendulum motion of electrons. The pendulum motion of the electrons will act as an amplifier of the effect of the electrons on the plasma. Synchronous biasing of such an arrangement can result in an electron-rich core.

The disclosed method can be used in any of a variety of applications in which it is desirable to increase/modify the ion composition. For example, the disclosed method may find particular application for use with high molecular weight ion sources; for instance, carborane, decaborane, octadecaborane. Deposition is one issue that concerns ion sources using high molecular weight compounds. Heavy deposition may consequently decrease source life and efficiency. The deposition can be minimized by tailoring the nano pulse voltage to produce less of the depositing radicals. The applied nanopulse E-field can be tuned to reduce the production of the radicals responsible for undesirable deposition. By reducing the amount of the specific radicals that react on the surface, there will be less undesirable deposition.

Another desirable application of the disclosed method is with silicon-on-insulator (SOI) processes that use $H_2$ ion sources. Selectively increasing the composition of H+ directly correlates to increased throughput for these ion sources.

In addition, the disclosed method may be used in PLAD applications using $B_2H_6/H_2$ mixtures, which are processes that require high implant doses at low implant voltages. Currently, these processes suffer from low throughput due to long implant times resulting from low B ion densities. These processes also suffer from undesirably increased deposition due to the long implant times. By application of the disclosed method, it is expected that improved B ion density fractions can be achieved, thereby increasing throughput.

The applications of this invention are many fold. With this approach, it would be possible to modify the EEDF and consequently the ion/neutral composition of a plasma. Thus, any application using a plasma can stand to gain from this methodology.

The method described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art would include such devices as a readable or writeable CD, flash memory chips (e.g., thumb drives), various magnetic storage media, and the like.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

The functions and process steps herein may be performed automatically or wholly or partially in response to user command. An activity (including a step) performed automatically is performed in response to executable instruction or device operation without user direct initiation of the activity.

Although this invention has been described with reference to particular embodiments, it is to be understood that the embodiments and variations shown and described herein are for illustration purposes only. Modifications to the current design may be implemented by those skilled in the art, without departing from the scope of the invention. The processes and applications may, in alternative embodiments, be located on one or more (e.g., distributed) processing devices accessing a network. Further, any of the disclosed functions and steps may be implemented in hardware, software or a combination of both and may reside on one or more processing devices located at any location of a network, including the Internet.

What is claimed is:

1. A method for modifying a sub-atmospheric pressure plasma, comprising:
    providing a feed gas to a chamber;
    exciting the feed gas to generate a plasma; and
    applying an electric field pulse to the plasma, the pulse having a rise time substantially equal to or less than the inverse of the electron plasma frequency and the pulse having a duration of less than the inverse of the ion plasma frequency;
    wherein the electric field pulse selectively affects the electrons of the plasma but does not substantially affect ions of the plasma; and
    wherein the affected electrons modify the composition, density, and temperature of the ions and neutrals in the plasma, wherein the step of providing a feed gas to a chamber comprises providing a feed gas chemistry that maximizes the concentration of desired ions or radicals in the plasma.

2. The method of claim 1, wherein the electric field pulse is applied at a value selected to maximize a concentration of desired ions or radicals in the plasma.

3. The method of claim 1, wherein the electric field pulse is applied in a plasma doping tool.

4. The method of claim 1, wherein the electric field pulse is generated by applying a voltage to a surface in contact with the process gas.

5. The method of claim 1, wherein there are a plurality of electric field pulse sources that apply the electric field pulse to the plasma.

6. The method of claim 5, wherein first and second of the plurality of the electric field pulse sources provide pulses that are asynchronous with respect to each other.

7. The method of claim 5, wherein first and second of the plurality of the electric field pulse sources provide synchronous pulses.

8. The method of claim 1, wherein the plasma process gas comprises a compound selected from the list consisting of carborane, decaborane and octadecaborane.

9. The method of claim 1, wherein the step of applying an electric field pulse modifies the electron energy distribution function of the plasma and the ion\neutral composition of the plasma.

10. A method for modifying a sub-atmospheric pressure plasma, comprising:
    providing a feed gas to a chamber;
    exciting the feed gas to generate a plasma; and
    applying an electric field pulse to the plasma, the pulse having a rise time substantially equal to or less than the inverse of the electron plasma frequency and the pulse having a duration of less than the inverse of the ion plasma frequency,
    wherein the electric field pulse selectively affects the electrons of the plasma but does not substantially affect ions of the plasma;
    wherein controlling at least one of the pulse rise time, the pulse duration, and the pulse amplitude modifies the composition, density, and temperature of the ions and neutrals in the plasma through the control of the electron density and energy distribution; and
    wherein the step of providing a feed gas to a chamber comprises providing a feed gas chemistry that maximizes the concentration of desired ions or radicals in the plasma.

11. The method of claim 10, wherein the electric field pulse is applied at a value selected to maximize a concentration of desired ions or radicals in the plasma.

12. The method of claim 10, wherein the electric field pulse is applied in a plasma doping tool.

13. The method of claim 10, wherein the electric field pulse is applied to a plasma etching tool.

14. The method of claim 10, wherein the electric field pulse is applied to a plasma enhanced chemical vapor deposition tool.

15. The method of claim 10, wherein a plurality of electric field pulse sources are applied to the plasma.

16. The method of claim 15, wherein first and second of the plurality of the electric field pulse sources provide pulses that are asynchronous with respect to each other.

17. The method of claim 15, wherein first and second of the plurality of the electric field pulse sources provide synchronous pulses.

18. The method of claim 10, wherein the plasma process gas comprises a compound selected from the list consisting of carborane, decaborane and octadecaborane.

19. The method of claim 10, wherein the step of applying an electric field pulse modifies the electron energy distribution function of the plasma and the ion/neutral composition of the plasma.

20. The method of claim 10, wherein the electric field pulse is generated by applying a voltage to a surface in contact with the process gas.

21. A method for adjusting a plasma, comprising:
applying a first and second electric field pulses to the plasma, the pulses having a rise time substantially equal to or less than the inverse of the electron plasma frequency, the pulse having a duration of less than the inverse of the ion plasma frequency;
wherein the first and second electric field pulse selectively affects the electrons of the plasma but does not substantially affect ions of the plasma,
wherein the first electric field pulse is applied to the plasma by first electric field pulse source and the second electric field pulse is applied to the plasma by second electric field pulse source, and
wherein the first and second electric filed pulses are synchronous with respect to each other.

22. A method for adjusting a plasma, comprising:
applying a first and second electric field pulses to the plasma, the pulses having a rise time substantially equal to or less than the inverse of the electron plasma frequency, the pulse having a duration of less than the inverse of the ion plasma frequency;
wherein the first and second electric field pulse selectively affects the electrons of the plasma but does not substantially affect ions of the plasma,
wherein the first electric field pulse is applied to the plasma by a first electric field pulse source and the second electric field pulse is applied to the plasma by a second electric field pulse source, and
wherein the first and second electric filed pulses are asynchronous with respect to each other.

* * * * *